(12) United States Patent
Steen et al.

(10) Patent No.: US 7,253,621 B2
(45) Date of Patent: Aug. 7, 2007

(54) METHOD AND SYSTEM TO DYNAMICALLY CONFIGURE TRANSMIT RECEIVE COILS TO CALIBRATE A MAGNETIC RESONANCE IMAGING SYSTEM

(75) Inventors: Phillip Edward Steen, Delafield, WI (US); Ceylan Celil Guclu, Waukesha, WI (US); Tsinghua Zheng, Aurora, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/087,006

(22) Filed: Mar. 22, 2005

(65) Prior Publication Data

US 2006/0214661 A1    Sep. 28, 2006

(51) Int. Cl.
*G01V 3/00* (2006.01)

(52) U.S. Cl. .................. 324/318; 324/322; 600/422

(58) Field of Classification Search ............... 324/318, 324/322; 600/422
See application file for complete search history.

(56) References Cited

U.S. PATENT DOCUMENTS

| 4,975,644 | A | * | 12/1990 | Fox ........................... 324/318 |
| 5,565,779 | A | * | 10/1996 | Arakawa et al. ............ 324/318 |
| 5,635,837 | A | * | 6/1997 | Bornert ...................... 324/309 |
| 6,289,232 | B1 | * | 9/2001 | Jakob et al. ................ 600/410 |
| 6,377,044 | B1 |   | 4/2002 | Burl et al. |
| 6,396,273 | B2 |   | 5/2002 | Misic |
| 6,512,374 | B1 |   | 1/2003 | Misic et al. |
| 6,552,538 | B2 | * | 4/2003 | DeMeester et al. ......... 324/307 |
| 6,943,548 | B1 | * | 9/2005 | Hertz ......................... 324/309 |

* cited by examiner

*Primary Examiner*—Louis M. Arana
(74) *Attorney, Agent, or Firm*—Armstrong Teasdale LLP

(57) ABSTRACT

Magnetic Resonance Imaging (MRI) systems including a coil system and methods for controlling the coil system are described. A described system includes a coil system for MRI. The coil system includes a local volume coil configured to transmit and receive MRI signals and an array of surface coils configured to receive MRI signals.

20 Claims, 10 Drawing Sheets

METHOD AND SYSTEM TO DYNAMICALLY CONFIGURE TRANSMIT RECEIVE COILS TO CALIBRATE A MAGNETIC RESONANCE IMAGING SYSTEM

BACKGROUND OF THE INVENTION

This invention relates generally to Magnetic Resonance Imaging (MRI) systems, and more particularly, to Radio Frequency (RF) coils used in MRI systems.

To acquire images, MRI systems utilize nuclear spins of hydrogen in the water contained in a patient to be imaged. The nuclear spins of hydrogen are polarized by a magnetic field ($B_0$), which is typically generated by a magnet. The patient to be imaged is placed in a bore of the magnet. The polarized nuclear spins generate magnetic moments in the patient that get aligned parallel to the direction of the $B_0$. Data acquisition is performed by exciting the magnetic moments in a Region of Interest (ROI) in the patient with a uniform RF magnetic field ($B_1$) orthogonal to $B_0$. $B_1$ is typically generated by an RF transmit coil. $B_1$ excites the ROI and causes the magnetic moments to align away from $B_0$ by a predetermined angle. As the magnetic moments precess around $B_0$ axis, the magnetic moments release absorbed energy to return to a steady state. In releasing absorbed energy, the magnetic moments generate a magnetic resonance signal, i.e., the energy is released at a resonance frequency. This resonance signal is received by the same or different RF coil in a reception mode. The receive coil can, therefore, be either the transmit RF coil or a receive-only RF coil. The receive RF coil is typically positioned in the vicinity of the excited ROI.

Before scanning the patient to acquire an image, the MRI system may be calibrated by performing a prescan. A prescan is used to optimize the image acquisition, for example, for a specific body part and may include calculation of autoshim information or shim parameters, and Transmit Gain (TG) information. The TG information determines the RF power emitted by the transmitter. Calibration of the TG information is important because power absorption is dependent on patient size, and the TG information has to be adjusted for each patient. Further, inhomogeneities may be introduced in $B_0$ due to the patient's tissue. The inhomogeneities can be compensated to some degree by small gradient magnetic fields called shim fields. Therefore, during calibration, shim parameters, such as current, are calculated and configured for compensation.

The RF coils used for scanning are also used for the prescan. The RF coils used may be volume coils or surface coils. Further the RF coils may be local or body coils. Local coils can transmit to or receive signals only from a small part of the patient, whereas the body coil generally has a larger coverage area and can be used to transmit or receive signals to the whole body of the patient. Using receive only local coils and transmit body coils provides a uniform RF excitation and good image uniformity. However, a high RF power is deposited in the patient. For a Transmit/Receive (T/R) local coil, the local coil provides the RF excitation to the ROI and receives the MRI signal. Use of T/R local coils, therefore, decreases the RF power deposited. Conventionally, the RF coils utilized in MRI systems are used in either quadrature mode or phased-array mode. RF coils in quadrature mode are sensitive to signals 90 degrees out of phase and are generally used when speed of reconstruction is critical. Alternately, the receiver coils may be operated in a phased-array mode in which the 90 degree offset signals are forwarded to separate receivers. Operation in phased-array mode is typically used when image quality is critical.

Generally, T/R phased-array RF coils are used in MRI systems. However, while using these coils only a single receive channel is used to calculate the TG information and shim parameters during the prescan. This may lead to less than acceptable calibration parameters, which may further lead to image quality degradation.

BRIEF DESCRIPTION OF THE INVENTION

In one exemplary embodiment, a coil system for magnetic resonance imaging (MRI) is provided. The coil system includes a local volume coil configured to transmit and receive MRI signals and an array of surface coils configured to receive MRI signals.

In another exemplary embodiment, a method for controlling coils in a MRI system is provided. The method includes providing a local volume coil and an array of surface coils. The method further includes configuring the local volume coil to transmit and receive in a calibration mode of operation and configuring the local volume coil to transmit and the array of surface coils to receive during a scan mode of operation.

DETAILED DESCRIPTION OF THE INVENTION

Figure 1:
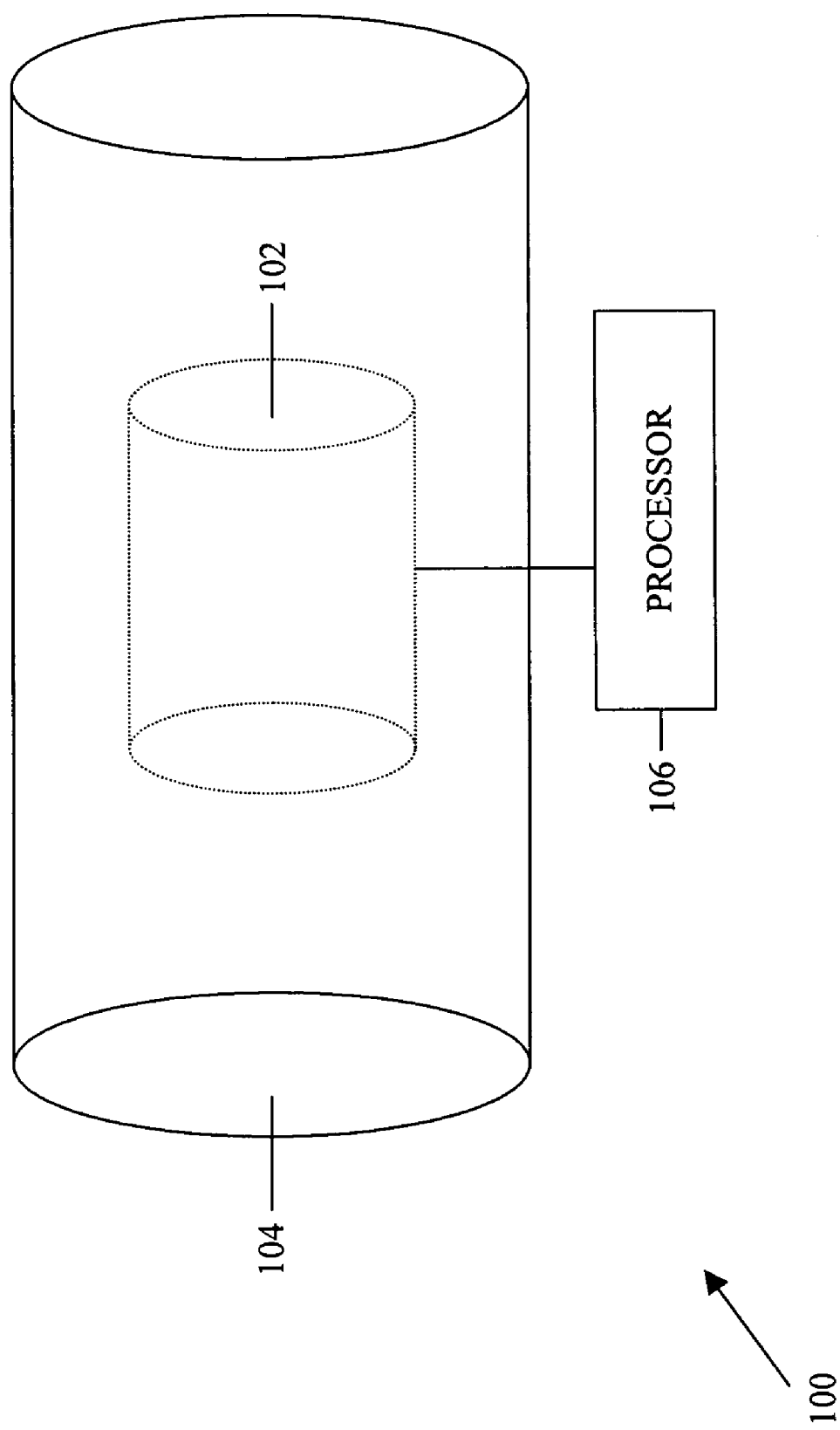
FIG. 1 is a schematic diagram of a Magnetic Resonance Imaging (MRI) system.

FIG. 1 is a schematic diagram of a Magnetic Resonance Imaging (MRI) system 100. MRI system 100 includes a coil system 102, a magnet 104 and a processor 106. In MRI system 100, a magnetic field, $B_0$, is provided (e.g., generated) by magnet 104. $B_0$ polarizes the nuclear spins of hydrogen in the water contained in a patient to be scanned. The patient is placed in a bore of magnet 104. The polarized nuclear spins develop magnetic moments that get aligned parallel to the direction of the axis of $B_0$. Further, coil system 102, which includes RF coils, is used to generate a magnetic field, $B_1$, to excite the magnetic moments in the Region of Interest (ROI). The excited magnetic moments emit a magnetic resonance signal by releasing energy at a resonance frequency to return to a steady state. This released energy is received by coil system 102 as the MRI image data. The received MRI image data is then used to reconstruct an image of the scanned ROI. Processor 106 is configured to process the received MRI signal as is known (e.g., reconstruct an image from the received MRI data). Processor 106 also includes controls for transmitting and receiving the MRI signals.

MRI system 100 operates in two modes, namely, a calibration mode and a scan mode. MRI system 100 performs prescan calibration operations in the calibration mode and acquires MRI image data in the scan mode. During the calibration mode, also referred to as prescan, various embodiments of the invention facilitate acquisition of prescan calibration information including, for example, shim parameters and Transmit Gain (TG) information. The calibration information then may be used in configuring MRI system 100 and preparing MRI system 100 for scanning the patient. Further, various embodiments of the invention facilitate the acquisition of reference images with coil system 102 for receiver calibration and image intensity correction during the prescan calibration.

In accordance with various embodiments of the invention, to control operation of MRI system 100 in the two modes, MRI system 100 includes coil system 102 and a control system. The control system may be included as a part of processor 106. The control provided by the control system includes dynamic switching between the calibration mode and the scan mode of MRI system 100 as described in more detail herein. This switching is transparent to the operator. For configuring MRI system 100 in the two modes, the RF coils of coil system 102 are automatically configured for transmitting or receiving as required by applying appropriate bias. Accordingly, various embodiments of the invention provide a method for controlling the RF coils in MRI system 100.

Figure 2:
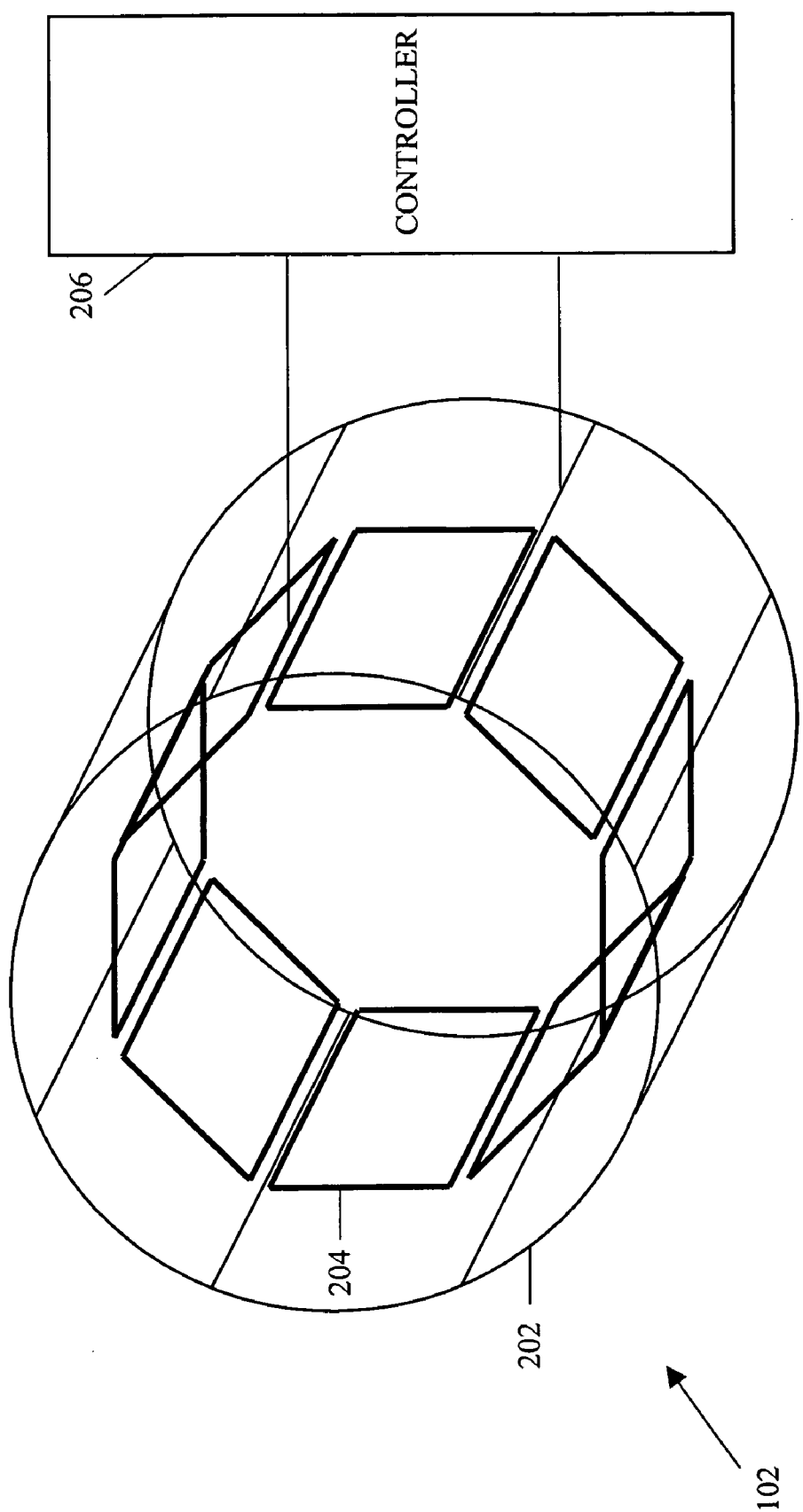
FIG. 2 is a schematic diagram of a coil system of an MRI system in accordance with various embodiments of the invention.

FIG. 2 is a schematic diagram of coil system 102 in accordance with various embodiments of the invention. As described, MRI system 100 includes coil system 102 (shown in FIG. 1) and the control system. Coil system 102 includes a local volume coil 202 and an array of surface coils 204, such that elements of local volume coil 202 correspond to coil elements of the array of surface coils 204. Therefore, when local volume coil 202 is used to transmit and the array of surface coils 204 is used to receive. The control system includes controller 206 that controls the configuration of coil system 102 as described in more detail herein.

In accordance with various embodiments of the invention, local volume coil 202 is positioned adjacent to the object, e.g., the ROI within the patient. Further, local volume coil 202 is of a size such that it encompasses at least a portion of the object to be imaged. Local volume coil 202 in an embodiment, is a Transmit/Receive (T/R) RF coil and can be configured to transmit or receive MRI signals during the calibration and scan modes. Local volume coil 202 operates as a transmit coil to generate magnetic field $B_1$ in the calibration as well as scan mode. Local volume coil 202 is used for transmission because it has high field homogeneity and, therefore, the image obtained has a good uniformity. Local volume coil 202 also receives prescan calibration information in the calibration mode. The prescan calibration information may include, for example, TG information and autoshim information. The shim parameters are used to calibrate the shim fields in the autoshim mode of MRI system 100. In addition, in the calibration mode, local volume coil 202 receives reference image information that may be used to provide uniformity correction prescan information. This is performed by acquiring two low-resolution calibration scans using the local volume coil 202 and the array of surface coils 204. These two sets of low-resolution scans are used to correct for the receive field inhomogeneity in the subsequent clinical scans. In accordance with various embodiments of the invention, local volume coil 202 is a birdcage coil. Birdcage coils typically include 8 or 16 elements that are connected between two annular rings. The elements are aligned along the direction of $B_0$ on a the birdcage coil is capable of producing a uniform $B_1$ field.

In accordance with various embodiments of the invention, the array of surface coils 204 is positioned within local volume coil 202. The array of surface coils 204 includes receive only RF coils and can be configured to receive MRI signals. The array of surface coils 204 also receives receiver calibration information during prescan. The prescan process determines the strongest signal over all the channels and adjusts the gain of each channel so as to not overrange the receiver In addition, the array of surface coils 204 receives clinical MRI image information during the scan mode. In accordance with various embodiments of the invention, the array of surface coils 204 is a phased-array coil. The phased-array coil includes a plurality of local surface coils such that the individual coils are electrically isolated from each other in any known manner. Each element acts as a separate coil while receiving the MRI signals. Therefore, the phased-array coil has a high sensitivity like a small local surface coil, while covering a larger area.

The control system of MRI system 100 includes a controller 206. Controller 206 is configured to control the operation of local volume coil 202 and the array of surface coils 204 in both the calibration mode and scan mode of operation. In the calibration mode, controller 206 configures local volume coil 202 for both transmitting and receiving. Further, in the scan mode, controller 206 configures local volume coil 202 for transmitting and the array of surface coils 204 for receiving.

In accordance with various embodiments of the invention, controller 206 controls the enabling and disabling of local volume coil 202 and the array of surface coils 204. Local volume coil 202 and the array of surface coils 204 can be enabled and disabled using multicoil bias lines or control lines. The enabling and disabling is described further with reference to FIGS. 3-6.

Figure 3:
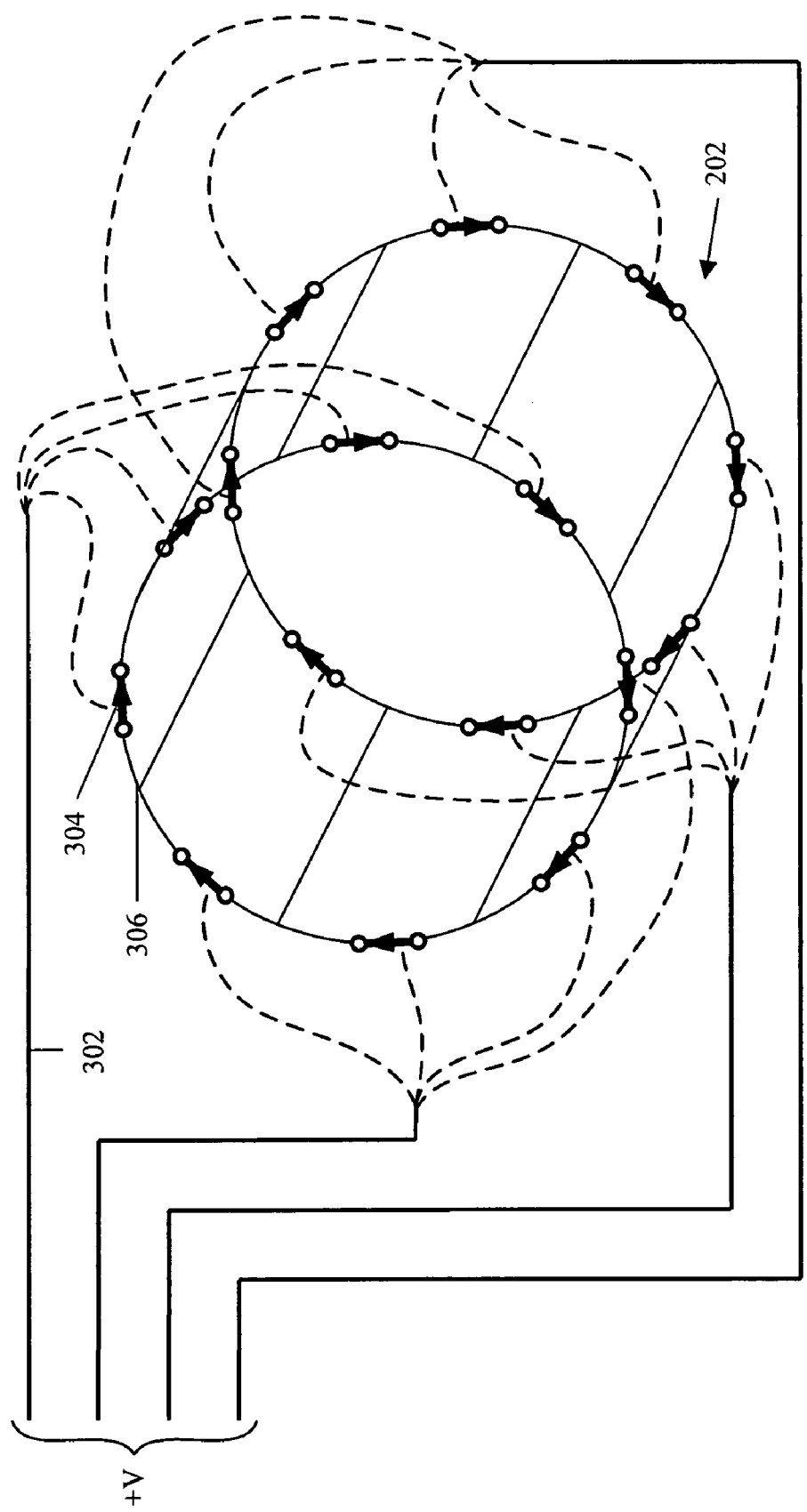
FIG. 3 is a schematic diagram of a local volume coil in an enabled state in accordance with various embodiments of the invention.
Figure 4:
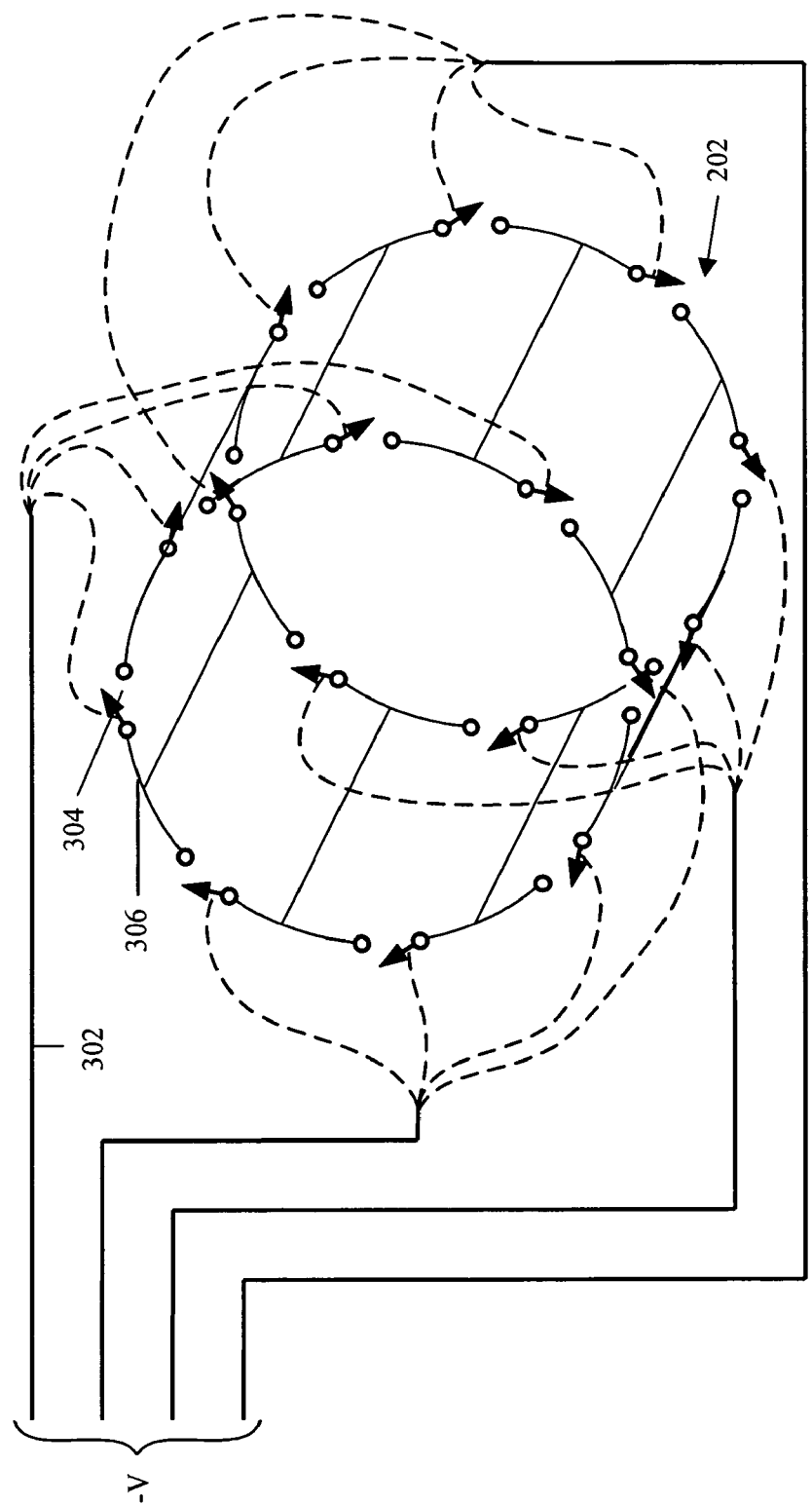
FIG. 4 is a schematic diagram of a local volume coil in a disabled state in accordance with various embodiments of the invention.

FIG. 3 is a schematic diagram of local volume coil 202 in an enabled state in accordance with various embodiments of the invention. The state of local volume coil 202 (shown in FIG. 2) is controlled using control lines, for example control line 302. Local volume coil 202 can be enabled or disabled by opening or closing switches, for example switch 304, on local volume coil 202. Each switch can enable or disable a section of the local volume coil 202. For example, switch 304 can enable or disable section 306. Application of a positive voltage through the control lines, for example control line 302, causes switches, for example, switch 304, on local volume coil 202 to close. Therefore, applying a positive voltage enables local volume coil 202. Similarly, FIG. 4 is a schematic diagram of local volume coil 202 in a disabled state in accordance with various embodiments of the invention. Application of a negative voltage through the control lines causes the switches on local volume coil 202 to open. Therefore, applying a negative voltage disables local volume coil 202.

Figure 5:
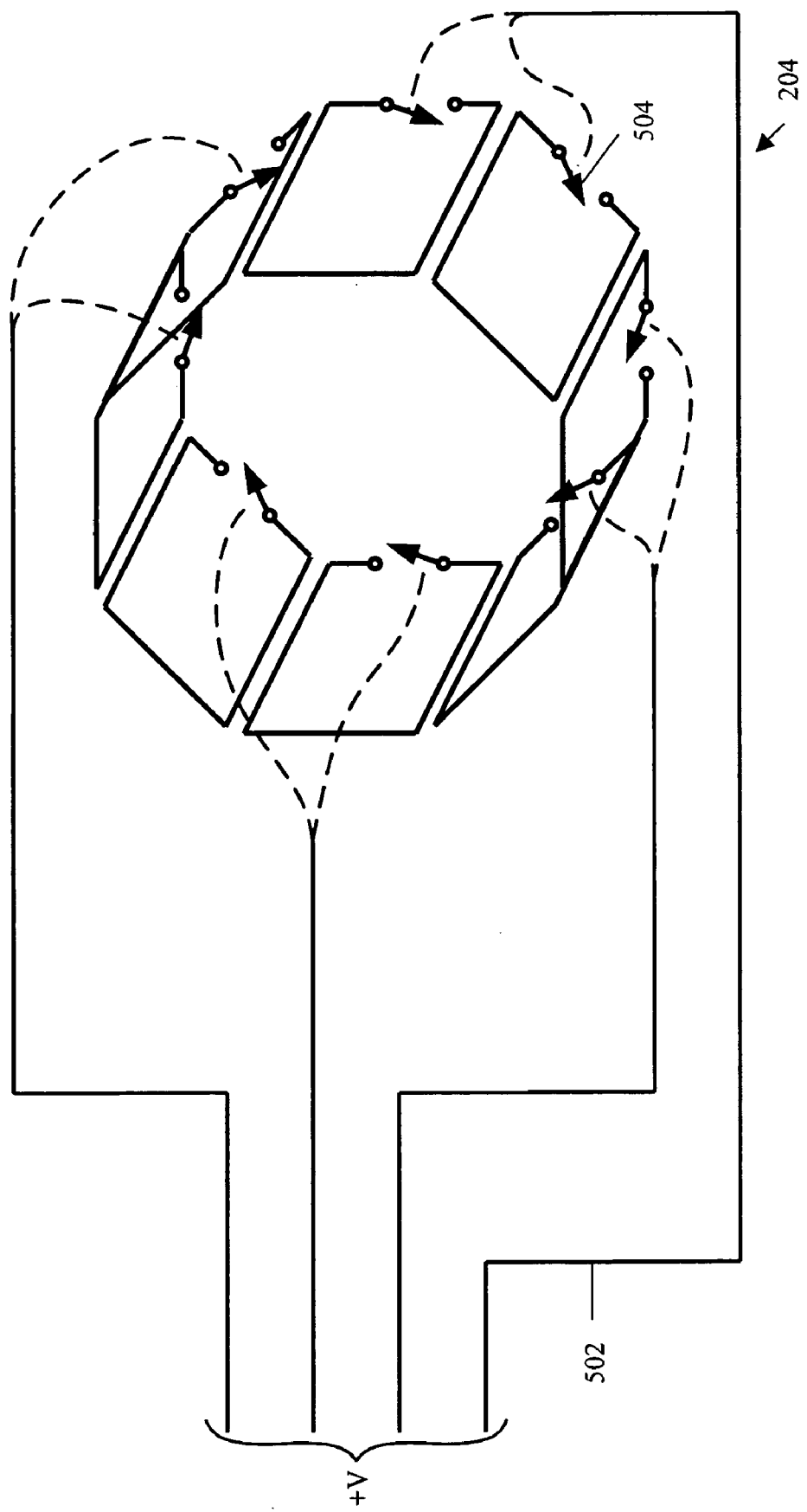
FIG. 5 is a schematic diagram of an array of surface coils in an disabled state in accordance with various embodiments of the invention.
Figure 6:
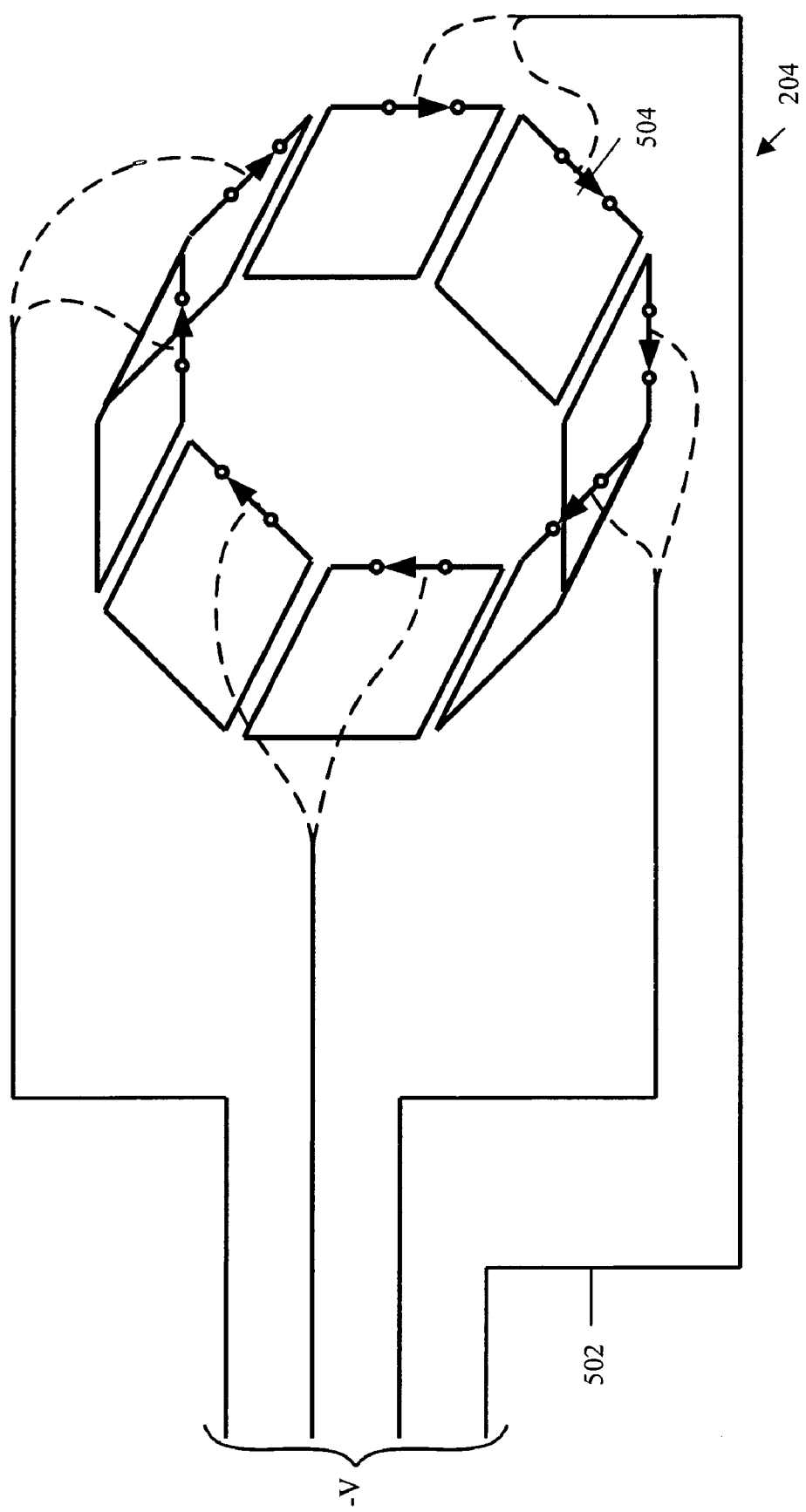
FIG. 6 is a schematic diagram of an array of surface coils in a enabled state in accordance with various embodiments of the invention.

FIG. 5 is a schematic diagram of the array of surface coils 204 in a disabled state in accordance with various embodiments of the invention. The enabled state of the array of surface coils 204 (as shown in FIG. 2) is controlled using control lines, for example, control line 502. The array of surface coils 204 can be enabled or disabled by opening or closing switches, for example, switch 504, on the array of surface coils 204. Each switch can enable or disable a section of the array of surface coils 204, for example, switch 504 can enable or disable section 506. Application of a negative voltage through the control lines causes the switches on the array of surface coils 204 to close. Therefore, applying a negative voltage enables the array of surface coils 204. FIG. 6 is a schematic diagram of the array of surface coils 204 in an enabled state in accordance with various embodiments of the invention. Application of a positive voltage through the control lines causes the switches on the array of surface coils 204 to open. Therefore, applying a positive voltage disables the array of surface coils 204. The control lines are not shown in the following figures, but may be configured in a similar manner to those already described herein. However, the switches on local volume coil 202 and array of surface coils 204 have been shown so as to illustrate state of local volume coil 202 and array of surface coils 204.

Figure 7:
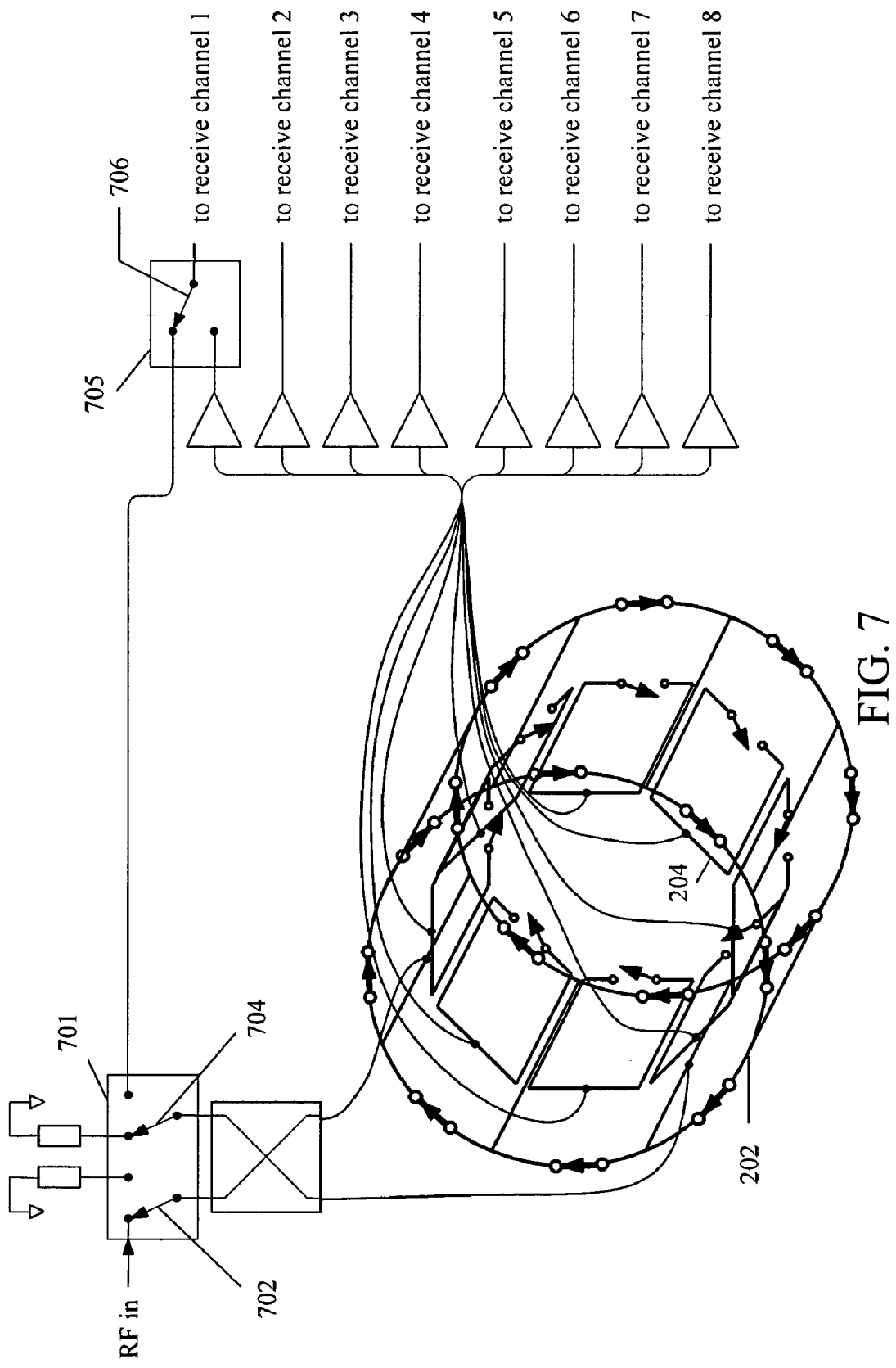
FIG. 7 is a schematic diagram of a local volume coil in a transmit state in accordance with various embodiments of the invention.
Figure 8:
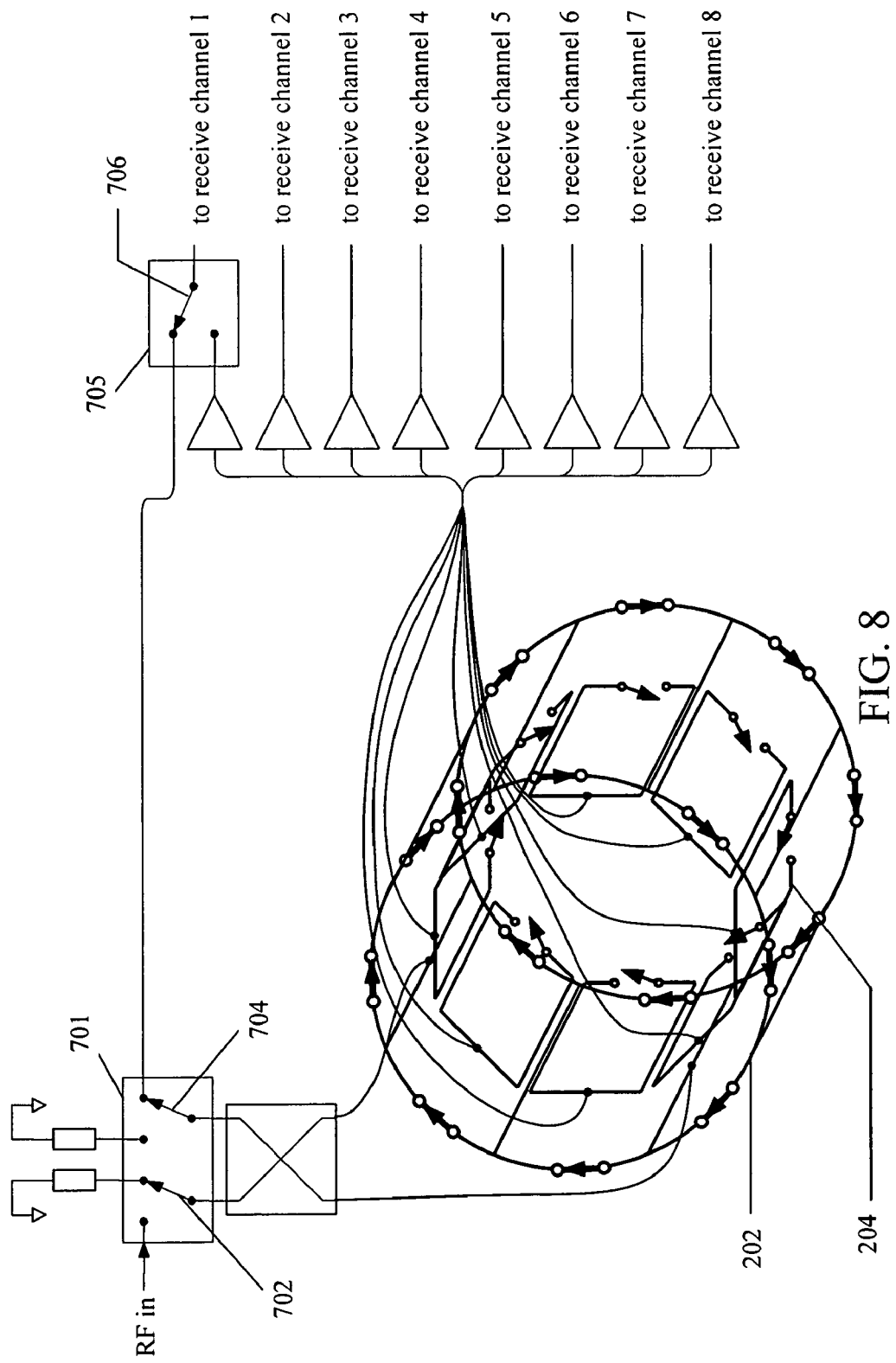
FIG. 8 is a schematic diagram of a local volume coil in a receive state in accordance with various embodiments of the invention.
Figure 9:
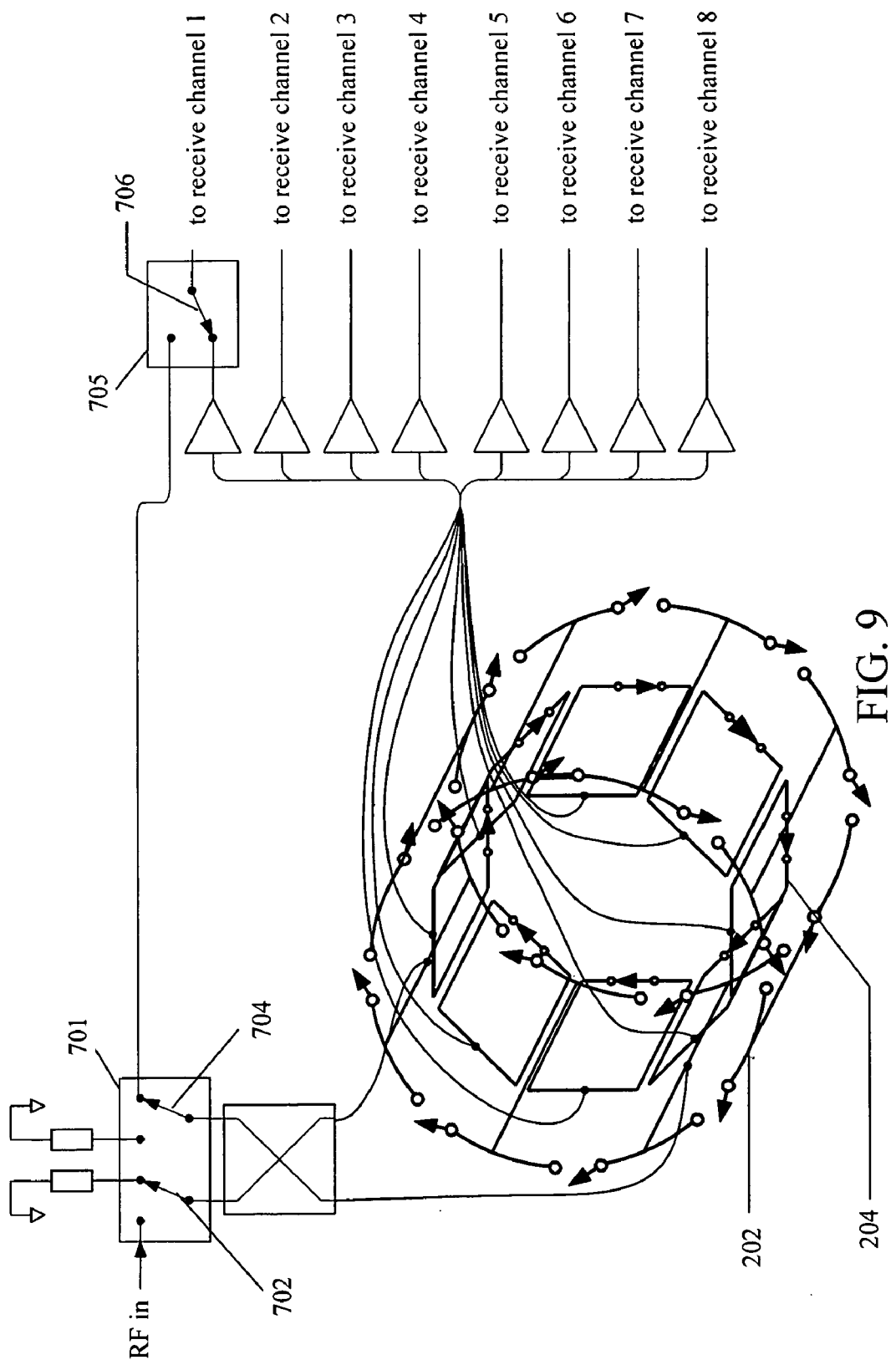
FIG. 9 is a schematic diagram of an array of surface coils in a receive state in accordance with various embodiments of the invention.

FIGS. 7-9 are schematic diagrams of the coil system 102 with mode control switches in accordance with various embodiments of the invention. The mode control switches control the transmit and receive modes of coil system 102 (shown in FIG. 1) as well as the calibration and scan modes of MRI system 100. MRI system 100 includes a first switching member 701 that includes Transmit/Receive (T/R) switches 702 and 704, configured to control transmit and receive operations of local volume coil 202 (shown in FIG. 2) and the array of surface coils 204 (shown in FIG. 2).

MRI system 100 further includes a second switching member 705 that includes a receive channel switch 706, configured to dynamically switch MRI system 100 (shown in FIG. 1) between the scan mode of operation and the calibration mode of operation. Switching between the calibration and scan mode is enabled by receive channel switch 706 by controlling the input to receive channel 1. MRI system 100 includes a plurality of receive channels. The receive channels receive prescan calibration information from different elements of local volume coil 202 (shown in FIG. 2). Further, the receive channels receive the MRI image information from the array of surface coils 204 (shown in FIG. 2) during the scan mode of MRI system 100. The receive channels may be included either as a part of the control system or as a part of coil system 102 (shown in FIG. 1). In accordance with various embodiments, receive channel switch 706 may control the input to a receive channel of MRI system 100 other than receive channel 1.

In accordance with various embodiments of the invention, receive channel switch 706 is a part of the control system. In accordance with various other embodiments, receive channel switch 706 is a part of coil system 102 (shown in FIG. 1). Receive channel switch 706 is controlled by controller 206. The operation of T/R switches 702 and 704 and receive channel switch 706 is explained in detail with reference to FIGS. 8-10.

FIG. 7 is a schematic diagram of local volume coil 202 in the transmit state, in accordance with various embodiments of the invention. In the transmit state, local volume coil 202 operates as a transmit coil and generates a RF magnetic field, $B_1$. The switches on local volume coil 202 are biased so as to enable local volume coil 202. In addition, positive voltage is applied to T/R switches 702 and 704 (shown in FIG. 7). This biasing of T/R switches 702 and 704 causes local volume coil 202 to be configured in the transmit mode. The transmit mode of local volume coil 202 is used during the calibration mode as well as the scan mode. The array of surface coils 204 is disabled in the transmit state, by opening the switches on the array of surface coils 204. Further, a positive voltage is applied to receive channel switch 706 (shown in FIG. 7), hence, MRI system 100 (shown in FIG. 1) is switched to the calibration mode. Therefore, receive channel switch 706 is biased such that the array of surface coils 204 is not connected to receive channel 1.

FIG. 8 is a schematic diagram of local volume coil 202 in the receive state in accordance with various embodiments of the invention. Similar to the transmit state, in the receive state, local volume coil 202 is enabled by closing the switches on local volume coil 202, and the array of surface coils 204 is disabled by opening the switches on the array of surface coils 204. The main difference in the configuration between the transmit state and the receive state is that a negative voltage is applied to T/R switches 702 and 704. Due to this biasing of T/R switches 702 and 704, local volume coil 202 is configured to act as a receive coil. However, receive channel switch 706 (shown in FIG. 7) is applied a positive voltage in this state. This biasing of receive channel switch 706 and T/R switch 702 connects local volume coil 202 to receive channel 1.

In the receive state, local volume coil 202 acquires, for example, the autoshim information and TG information. The autoshim information may be used in the autoshim mode of MRI system 100 (shown in FIG. 1) to calibrate the shim fields. Shim fields are small gradient fields that compensate for inhomogeneities that may be introduced in the magnetic field $B_0$. The TG information may be used to calibrate the output power of MRI system 100 to scan the patient in the scan mode.

FIG. 9 is a schematic diagram of the array of surface coils 204 in the receive state in accordance with various embodiments of the invention. In this state, local volume coil 202 is disabled by opening the corresponding switches as described herein. However, array of surface coils 204 is enabled by closing the corresponding switches as described herein. In addition, receive channel switch 706 is biased such that the array of surface coils 204 is connected to receive channel 1 and the array of surface coils 204 operates as a receive coil. Therefore, receiver calibration information such as, for example, maximum signal level from each channel is collected by the array of surface coils 204 in this state. This calibration information is used to adjust the gain of individual receivers to prevent overranging.

In the scan mode, to receive image signals, coil system 102 (shown in FIG. 1) is configured to the above described receive state of the array of surface coils 204 (shown in FIG. 2) during the scan mode. Therefore, the array of surface coils 204 acquires data corresponding to clinical images with coil system 102 in this state. However, in the calibration mode, as described with reference to FIG. 9, local volume coil 202 is configured to receive the MRI signals.

Figure 10:
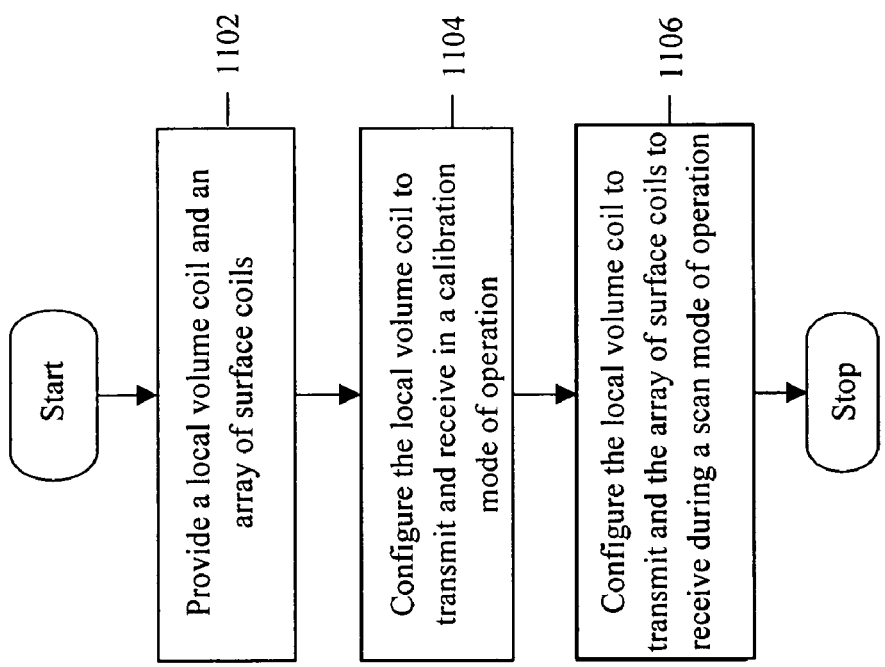
FIG. 10 is a flowchart for controlling a coil system of an MRI system in accordance with various embodiments of the invention.

FIG. 10 is a flowchart for controlling coil system 102 of MRI system 100 in accordance with various embodiments of the invention. At step 1102, a local volume coil 202, such as a birdcage coil, is provided, for example, for scanning a patient. In addition, an array of surface coils 204, such as a phased-array coils, is provided, for example, for scanning the patient. Local volume coil 202 and the array of surface coils 204 are configured to transmit or receive according to the mode of operation as described herein. During prescan or calibration mode, at step 1104, local volume coil 202 is configured to operate as a T/R coil. The configuration is described in connection with FIGS. 8 and 9. During the scan mode of MRI system 100, and at step 1106, local volume coil 202 is configured to transmit. This configuration of local volume coil 202 is described herein in connection with FIG. 8. In addition, at step 1106, the array of surface coils 204 is configured to receive. This configuration of array of surface coils 204 is described herein in connection with FIG. 10.

Various embodiments of the invention facilitate acquisition of, for example, autoshim information and TG information during prescan with a single transmit element of coil system 102 (shown in FIG. 1), e.g., local volume coil 202 (shown in FIG. 2). Further, various embodiments of the invention facilitate acquisition of reference images, that may be used for image intensity correction, by using coil system 102 configured such that local volume coil 202 transmits and the array of surface coils 204 (shown in FIG. 2) receives during prescan.

Various embodiments of the invention provide dynamic switching of MRI system 100 between a calibration and a scan mode. This switching is transparent to the operator, hence, no special coil configurations or manual user input is required during preparation of a scan of the patient.

While the invention has been described in terms of various specific embodiments, those skilled in the art will recognize that the invention can be practiced with modification within the spirit and scope of the claims.

What is claimed is:

1. A coil system for a magnetic resonance imaging (MRI) system configured to operate in a scan mode and a calibration mode, said coil system comprising:
    a local volume coil configured to transmit and receive MRI signals; and
    an array of surface coils configured to receive MRI signals, wherein the local volume coil includes a plurality of coil elements, wherein a first one of the coil elements of the local volume coil is configured to form a loop configured to remain open in a receiving state in the scan mode and configured to remain closed in a receiving state in the calibration mode.

2. A coil system in accordance with claim 1 wherein the local volume coil is configured to receive prescan calibration information.

3. A coil system in accordance with claim 2 wherein the prescan calibration information comprises at least one of autoshim information, fast transmit gain (TG) information and reference image information.

4. A coil system in accordance with claim 1 wherein the array of surface coils is configured to receive at least one of receiver calibration information and MRI image information.

5. A coil system in accordance with claim 1 wherein the local volume coil comprises a birdcage coil.

6. A coil system in accordance with claim 1 wherein the array of surface coils is positioned within the local volume coil.

7. A coil system in accordance with claim 1 further comprising a plurality of receive channels configured to receive prescan calibration information from the local volume coil.

8. A coil system in accordance with claim 1 further comprising at least one switch configured to switch between the scan mode of operation and the calibration mode of operation.

9. A coil system in accordance with claim 8 wherein the at least one switch is configured to provide dynamic switching between the modes of operation.

10. A coil system in accordance with claim 1 wherein the local volume coil is configured to be positioned adjacent to a portion of an object on which magnetic resonance imaging is to be performed.

11. A coil system in accordance with claim 1 wherein the coil elements of the local volume coil correspond to coils elements of the array of surface coils.

12. A control system for a magnetic resonance imaging (MRI) system configured to operate in a scan mode and a calibration mode, said control system comprising:
    a first switching member configured to control transmit and receive operations of a local volume coil and an array of surface coils of the MRI system during the scan mode of operation, wherein the local volume coil includes a plurality of coil elements, wherein a first one of the coil elements of the local volume coil is configured to form a loop configured to remain open in a receiving state in the scan mode and configured to remain closed in a receiving state in the calibration mode; and
    a second switching member configured to switch between the scan mode of operation and the calibration mode of operation.

13. A control system in accordance with claim 12 wherein the MRI system performs prescan calibration operations in the calibration mode of operation and the local volume coil receives prescan calibration information in the calibration mode of operation.

14. A control system in accordance with claim 13 wherein the prescan calibration information comprises at least one of autoshim information, fast transmit gain (TG) information and reference image information.

15. A control system in accordance with claim 12 wherein the local volume coil is configured to transmit and receive in the calibration mode of operation.

16. A control system in accordance with claim 12 wherein the local volume coil is configured to transmit and the array of surface coils is configured to receive in the scan mode of operation.

17. A control system in accordance with claim 12 further comprising a plurality of receive channels each corresponding to at least one of the coil elements of the array of surface coils.

18. A magnetic resonance imaging (MRI) system configured to operate in a scan mode and a calibration mode, the MRI system comprising:
    a surface coil array;
    a local volume coil, wherein the local volume coil includes a plurality of coil elements, wherein a first one of the coil elements of the local volume coil is configured to form a loop configured to remain open in a receiving state in the scan mode and configured to remain closed in a receiving state in the calibration mode; and
    a controller configured to control operation of the surface coil array and local volume coil in each of the calibration mode and the scan mode, wherein the controller provides (i) in the calibration mode for both transmitting and receiving by the local volume coil to acquire calibration information and (ii) in the scan mode for transmitting by the local volume coil and receiving by the surface coil array to acquire images of an object.

19. An MRI system in accordance with claim 18 wherein the calibration information comprises at least one of autoshim information, fast transmit gain (TG) information and reference image information.

20. A method for controlling coils in a magnetic resonance imaging (MRI) system configured to operate in a scan mode and a calibration mode, the system, said method comprising:

providing a local volume coil and an array of surface coils, wherein the local volume coil includes a plurality of coil elements, wherein a first one of the coil elements of the local volume coil is configured to form a loop configured to remain open in a receiving state in the scan mode and configured to remain closed in a receiving state in the calibration mode;

configuring the local volume coil to transmit and receive in the calibration mode of operation; and configuring the local volume coil to transmit and the array of surface coils to receive during the scan mode of operation.

* * * * *